(12) United States Patent
Scheuerlein et al.

(10) Patent No.: US 6,868,022 B2
(45) Date of Patent: Mar. 15, 2005

(54) REDUNDANT MEMORY STRUCTURE USING BAD BIT POINTERS

(75) Inventors: Roy E. Scheuerlein, Cupertino, CA (US); Mark G. Johnson, Los Altos, CA (US); Derek J. Bosch, Mountain View, CA (US); Alper Ilkbahar, San Jose, CA (US); J. James Tringali, Los Altos, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 123 days.

(21) Appl. No.: 10/402,385

(22) Filed: Mar. 28, 2003

(65) Prior Publication Data

US 2004/0190357 A1 Sep. 30, 2004

(51) Int. Cl.[7] ................................................. G11C 7/00
(52) U.S. Cl. ....................................... 365/201; 365/200
(58) Field of Search ................................ 365/201, 200, 365/189.07

(56) References Cited

U.S. PATENT DOCUMENTS

| | | | |
|---|---|---|---|
| 4,646,266 A | 2/1987 | Ovshinsky et al. | |
| 5,278,839 A | 1/1994 | Matsumoto et al. | |
| 5,313,425 A | 5/1994 | Lee et al. | |
| 5,432,729 A | 7/1995 | Carson et al. | |
| 5,469,450 A | 11/1995 | Cho et al. | |
| 5,579,265 A | 11/1996 | Devin | |
| 5,642,318 A | * 6/1997 | Knaack et al. | 365/201 |
| 5,701,267 A | * 12/1997 | Masuda et al. | 365/201 |
| 5,708,667 A | 1/1998 | Hayashi | |
| 5,751,647 A | 5/1998 | O'Toole | |
| 5,757,700 A | 5/1998 | Kobayashi | |
| 5,784,391 A | 7/1998 | Konigsburg | |
| 5,796,694 A | 8/1998 | Shirane | |
| 5,831,989 A | 11/1998 | Fujisaki | |
| 5,835,396 A | 11/1998 | Zhang | |
| 5,835,509 A | 11/1998 | Sako et al. | |
| 5,872,790 A | 2/1999 | Dixon | |
| 5,909,049 A | 6/1999 | McCollum | |
| 5,920,502 A | * 7/1999 | Noda et al. | 365/185.09 |
| 5,943,254 A | 8/1999 | Bakeman, Jr. et al. | |
| 6,016,269 A | 1/2000 | Peterson et al. | |
| 6,026,476 A | 2/2000 | Rosen | |
| 6,034,882 A | 3/2000 | Johnson et al. | |
| 6,185,122 B1 | 2/2001 | Johnson et al. | |
| 6,216,247 B1 | 4/2001 | Creta et al. | |
| 6,236,587 B1 | 5/2001 | Gudesen et al. | |
| 6,420,215 B1 | 7/2002 | Knall et al. | |
| 6,462,988 B1 | 10/2002 | Harari | |

(List continued on next page.)

FOREIGN PATENT DOCUMENTS

WO  WO 99/14763  3/1999

OTHER PUBLICATIONS

"Reed–Solomon Codes," http://www.4i2i.com/reed_solomon_codes.htm, 8 pages (1998).

(List continued on next page.)

Primary Examiner—Anh Phung
(74) Attorney, Agent, or Firm—Brinks Hofer Gilson & Lione

(57) ABSTRACT

The preferred embodiments described herein relate to a redundant memory structure using bad bit pointers. In one preferred embodiment, data is written in a first plurality of memory cells, and an error is detected in writing data in one of the memory cells. In response to the detected error, a pointer is written in a second plurality of memory cells, the pointer identifying which memory cell in the first plurality of memory cells contains the error. During a read operation, the data is read from the first plurality of memory cells, and the pointer is read from the second plurality of memory cells. From the pointer, the memory cell containing the error is identified, and the error is corrected. Other preferred embodiments are provided, and each of the preferred embodiments can be used alone or in combination with one another.

33 Claims, 8 Drawing Sheets

U.S. PATENT DOCUMENTS

| | | | |
|---|---|---|---|
| 6,498,749 B1 * | 12/2002 | Cuppens et al. | 365/185.09 |
| 6,515,923 B1 | 2/2003 | Cleeves | |
| 6,525,953 B1 | 2/2003 | Johnson | |
| 6,567,287 B2 | 5/2003 | Scheuerlein | |
| 6,574,145 B2 | 6/2003 | Kleveland et al. | |
| 6,591,394 B2 | 7/2003 | Lee et al. | |
| 6,597,595 B1 * | 7/2003 | Ichiriu et al. | 365/49 |
| 2002/0028541 A1 | 3/2002 | Lee et al. | |
| 2003/0115514 A1 | 6/2003 | Ilkbahar et al. | |
| 2003/0115518 A1 | 6/2003 | Kleveland et al. | |
| 2003/0120858 A1 | 6/2003 | March et al. | |

OTHER PUBLICATIONS

"A 30 ns 64Mb DRAM with Built–in Self–Test and Repair Function," 1992 IEEE International Solid State Circuits Conference, Digest of Technical Papers, pp. 150–151 (Feb. 1992).

"64M × 8 Bit NAND Flash Memory," Samsung Electronics, 40 pages (Oct. 27, 2000).

"Exotic Memories, Diverse Approaches," EDN Asia, pp. 22–33 (Sep. 2001).

"A Vertical Leap for Microchips," Thomas H. Lee, Scientific American, 8 pages (Jan. 2002; printed Dec. 10, 2001).

"Three–Dimensional Memory Array and Method of Fabrication," U.S. Appl. No. 09/560,626, filed Apr. 28, 2000; inventor: Johan Knall.

"A 16Mb Mask ROM with Programmable Redundancy," Nsruka et al., ISSCC 1989/Session 10: Nonvolatile Memories/Paper THAM 10.1, 2 pages, Feb. 16, 1989.

"Circuit Technologies for 16Mb DRAMs," Mano et al., ISSCC 1987/Session I: MEGABIT DRAMs/Paper WAM 1.6, 2 pages, Feb. 27, 1987.

"Method for Deleting Stored Digital Data from Write–Once Memory Device," U.S. Appl. No. 09/638,439, filed Aug. 14, 2000; inventors: Christopher S. Moore, Derek J. Bosch, Daniel C. Steere and J. James Tringali.

"Partial Selection of Passive Element Memory Cell SubArrays for Write Operation," U.S. Appl. No. 09/748,649, filed Dec. 22, 2000; inventors: Roy E. Scheuerlein and Matthew P. Crowley.

"Memory Device and Method for Storing and Reading Data in a Write–Once Memory Array," U.S. Appl. No. 09/877,720, filed Jun. 8, 2001; inventors: Christopher S. Moore, James E. Schneider, J. James Tringali and Roger W. March.

"Memory Device and Method for Storing and Reading a File System Structure in a Write–Once Memory Array," U.S. Appl. No. 09/877,719, filed Jun. 8, 2001; inventors: Christopher S. Moore, James E. Schneider, J. James Tringali and Roger W. March.

"Method for Reading Data in a Write–Once Memory Device Using a Write–Many File System," U.S. Appl. No. 09/818,138, filed Jun. 8, 2001; inventors: J. James Tringali, Christopher S. Moore, Roger W. March, James E. Schneider, Derek Bosch, and Daniel C. Steere.

"Method for Re–Directing Data Traffic in a Write–Once Memory Device," U.S. Appl. No. 09/877,691, filed Jun. 8, 2001; inventors: J. James Tringali, Christopher S. Moore, Roger W. March, James E. Schneider, Derek Bosch, and Daniel C. Steere.

"Method for Making a Write–Once Memory Device Read Compatible with a Write–Many File System," U.S. Appl. No. 10/023,468, filed Dec. 14, 2001; inventors: Christopher S. Moore, Matt Fruin, Colm Lysaght, and Roy E. Scheuerlein.

* cited by examiner

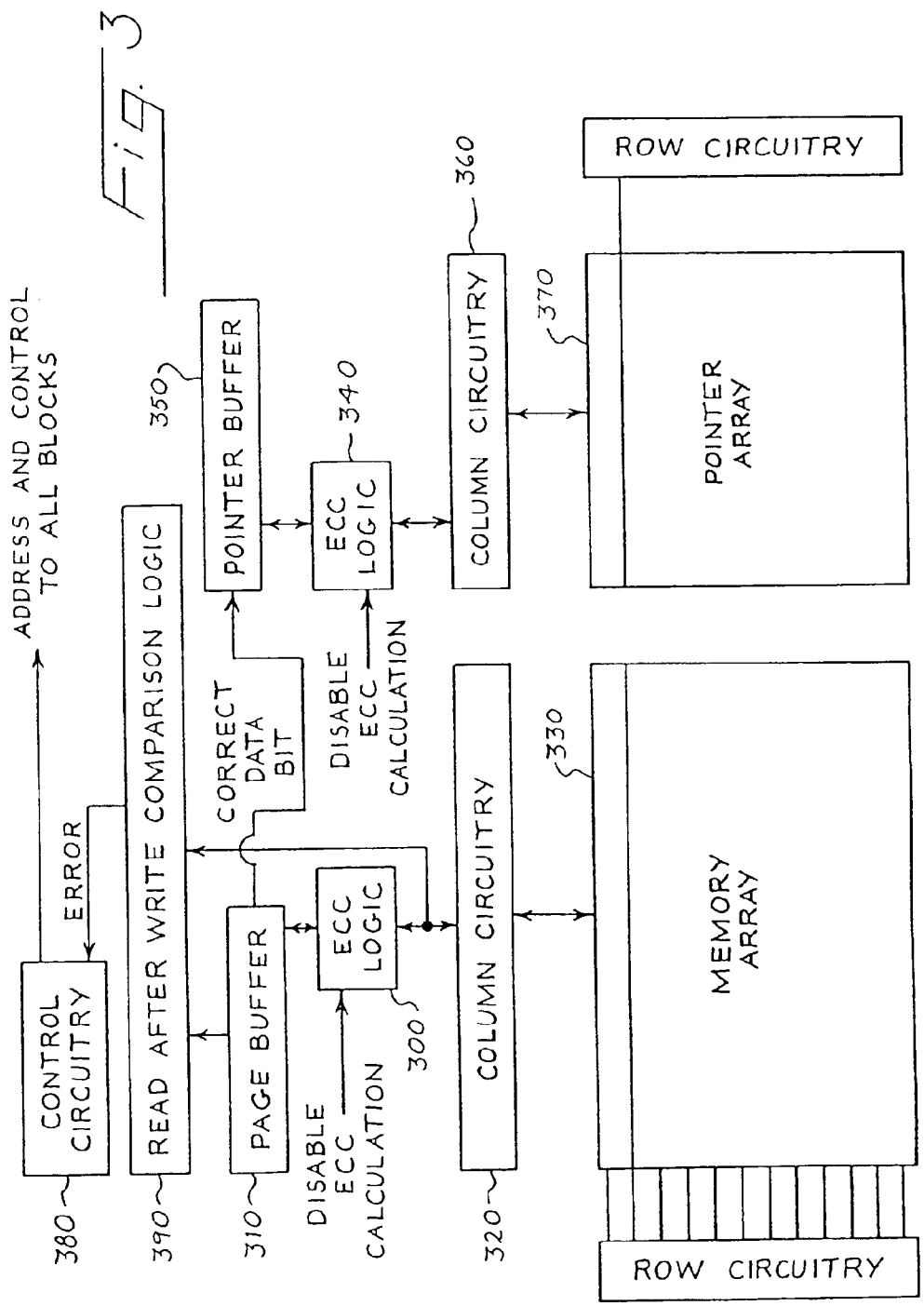

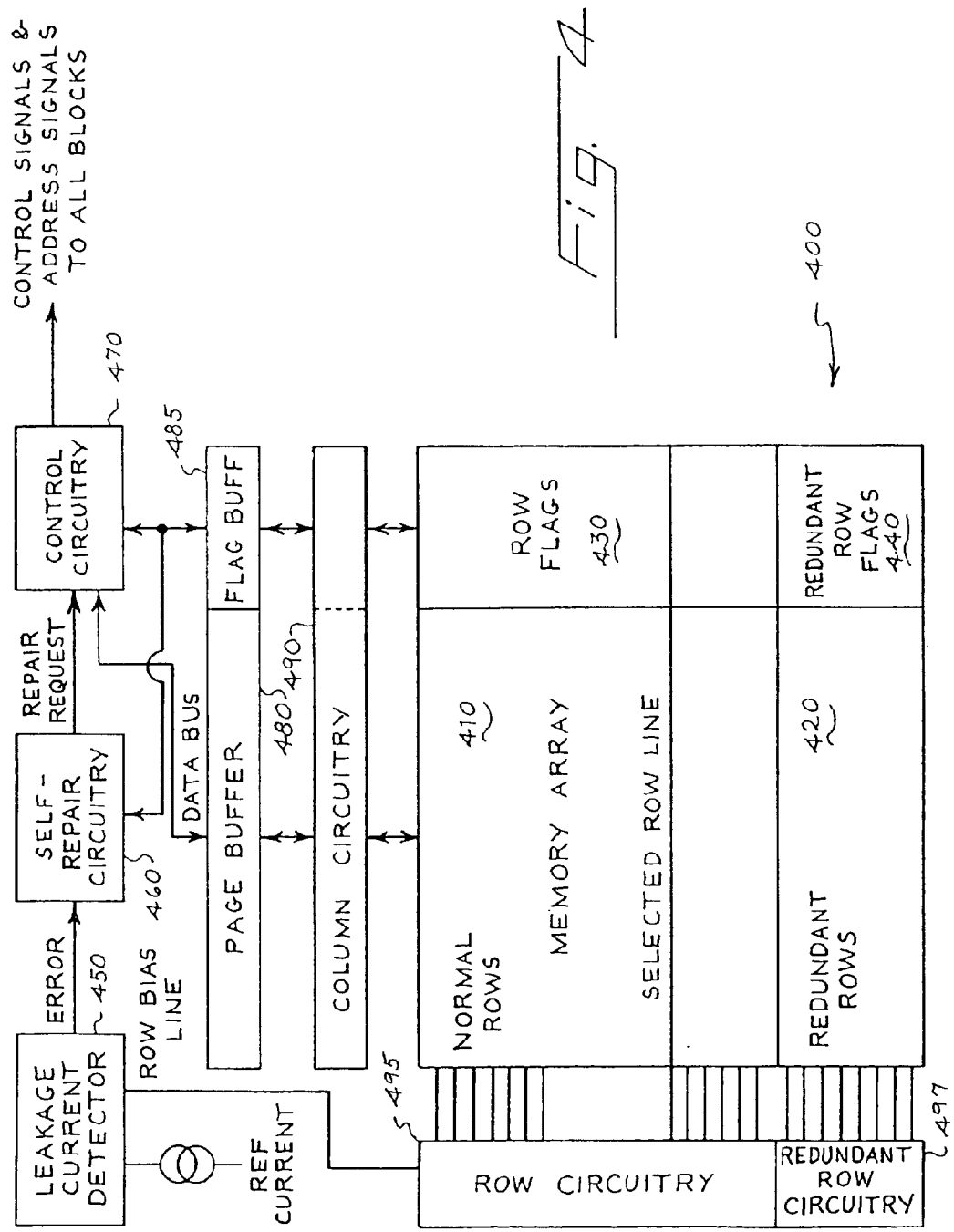

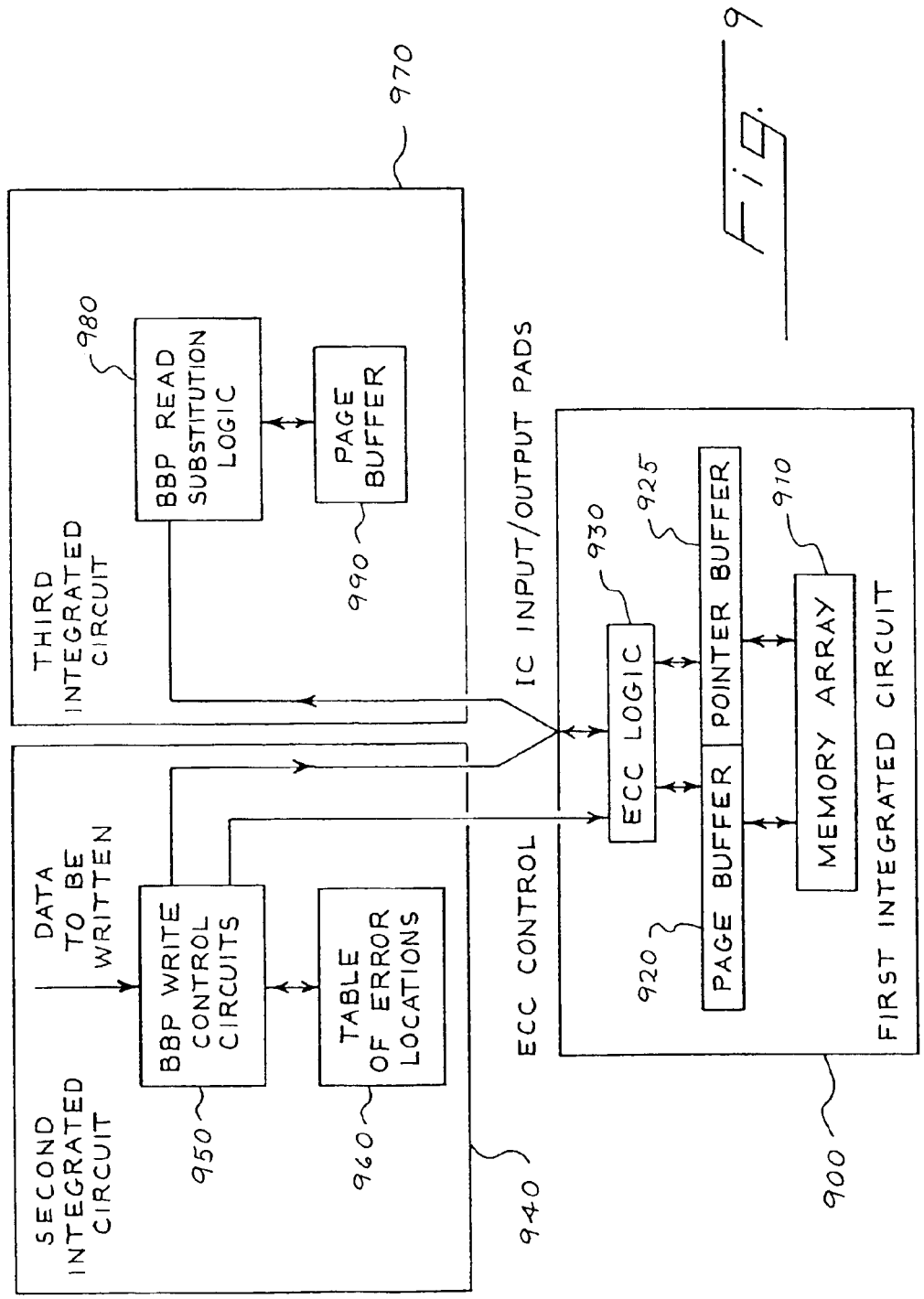

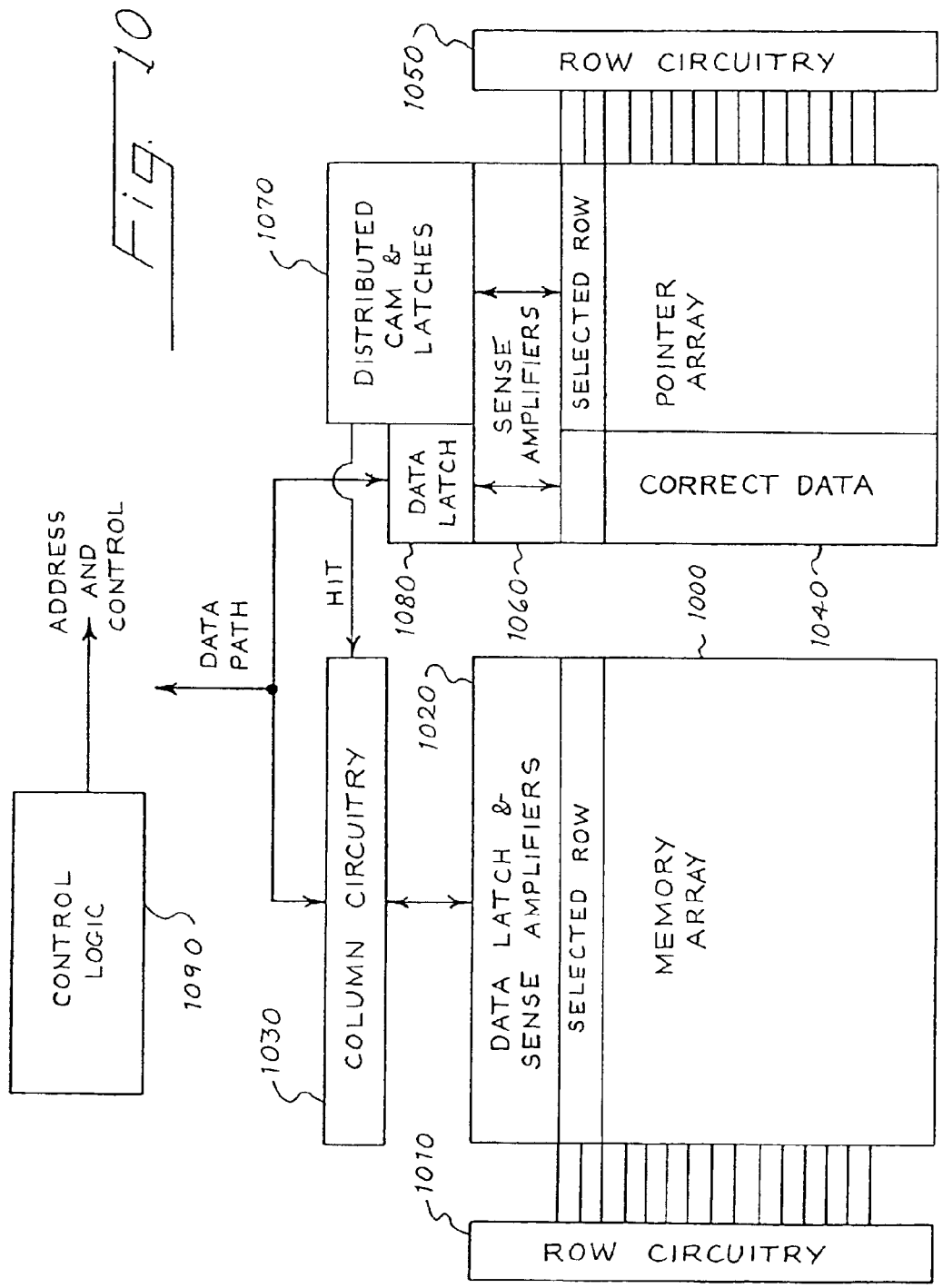

REDUNDANT MEMORY STRUCTURE USING BAD BIT POINTERS

BACKGROUND

As memory chip capacities increase and the size of features used to form the memory cells decrease, defects in manufacturing become more of an impediment to produce memory chips with high yield. This is especially true for PROM memory chips, such as those that contain anti-fuse memory cells, which cannot be fully tested at manufacturing. Defects are most commonly either bad rows of cells, bad columns of cells, or bad individual cells. Many memory circuits include redundancy circuitry having special address decoding circuits that replace a row or column of memory cells when a defective cell is detected in initial testing of the chip. For example, redundancy circuitry can have non-volatile memory elements, such as polysilicon fuse elements, in decoder circuitry that are programmed in the factory to indicate the address of bad rows or columns. See, for example, "A 16 Mb Mask ROM with Programmable Redundancy," Naruke et. al., ISSCC 89 THAM 10.1, Feb. 16, 1989, which describes spare rows and columns organized in a separate spare array and fuse elements to redirect addresses to the spare array. The fuses used to store the location or address of the bad lines can take-up a relatively large area in memories in which the area available for fuses is very limited.

While row redundancy can efficiently repair bad word lines and column redundancy can efficiently repair bad bit lines, neither efficiently repairs random bad cells. For example in page-oriented memory chips, a page contains all the information for 512 bytes of information. To simplify addressing when a row is replaced, all bits in the page are replaced. Accordingly, a single random bad cell repaired by row redundancy uses 4K redundant cells. Similarly, column redundancy uses many redundant cells to repair a single bad cell. In addition, using column redundancy to repair a single bad cell can be impractical in a page-oriented memory, as all previously-written pages in the portion or memory space defined by the bad column have to be moved to the redundant column.

Error correction code (ECC) can be used as an alternative method to improve memory yield and reliability. See, for example, "Circuit Technologies for 16 Mb DRAMs," Mano et. al., ISSCC 87 WAM 1.6, Feb. 25, 1987. Hamming code, a commonly-used error correction code, adds 8 bits of information for each group of 64 bits of data, and the added information can be used to correct an error in the resulting 72-bit word. The added 8 bits of information can be generated by logic circuitry, such as a tree of exclusive-or gates. When the 72-bit word is read from memory, the logic circuitry decodes the 72-bit word to generate the 64 bits of data and can correct a single-bit error caused by a bad column or a random bad bit. Although Hamming code can correct single-bit errors, the improvement in memory yield and reliability comes at the price of storing an extra 8 bits for each group of 64 bits—a 12% overhead of additional cells. Additionally, single-bit correction may not be sufficient to provide good yield when there are both bad columns and random bad bits since the combination of a bad column and a random bad bit in a 72-bit word leads to an uncorrectable double-bit error.

SUMMARY

The present invention is defined by the following claims, and nothing in this section should be taken as a limitation on those claims.

By way of introduction, the preferred embodiments described below provide a redundant memory structure using bad bit pointers. In one preferred embodiment, data is written in a first plurality of memory cells, and an error is detected in writing data in one of the memory cells. In response to the detected error, a pointer is written in a second plurality of memory cells, the pointer identifying which memory cell in the first plurality of memory cells contains the error. During a read operation, the data is read from the first plurality of memory cells, and the pointer is read from the second plurality of memory cells. From the pointer, the memory cell containing the error is identified, and the error is corrected. Other preferred embodiments are provided, and each of the preferred embodiments can be used alone or in combination with one another.

The preferred embodiments will now be described with reference to the attached drawings.

BRIEF DESCRIPTION OF THE DRAWINGS

FIG. 3 is a block diagram of a memory chip organization of a preferred embodiment in which ECC is used in combination with bad bit pointers.

FIG. 4 is a block diagram of a memory chip organization of a preferred embodiment having an on-chip current detector and self-repair mechanism for a passive matrix memory array.

FIG. 9 is a block diagram of a preferred embodiment in which bad bit pointer write and read circuits are located on separate chips from the memory array.

FIG. 10 is a block diagram of a memory chip organization of a preferred embodiment in which non-volatile random access memory is used with bad bit pointers.

DETAILED DESCRIPTION OF THE PRESENTLY

Preferred Embodiments

Figure 1:
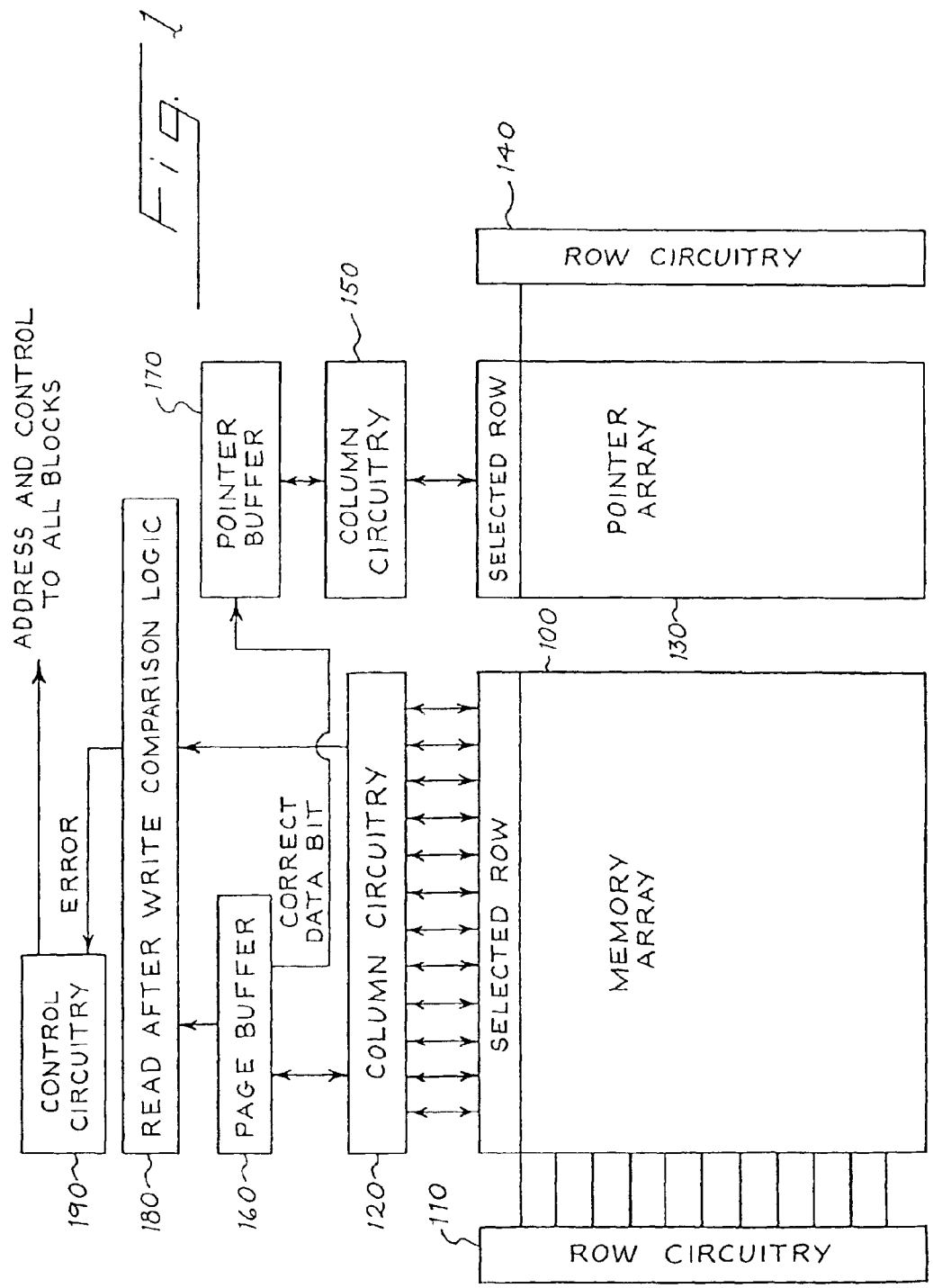
FIG. 1 is a block diagram of a memory chip organization of a preferred embodiment that uses bad bit pointers.

Turning now to the drawings, FIG. 1 is a block diagram of a memory chip organization of a preferred embodiment. As shown in FIG. 1, the memory comprises a memory array 100 with associated row and column circuitry 110, 120, a pointer array 130 with associated row and column circuitry 140, 150, a page buffer (or register) 160, a pointer buffer 170, read-after-write comparison logic 180, and control circuitry 190, which provides address and control information to all of the blocks shown in FIG. 1. Preferably, there is a simple one-to-one correspondence between rows in the memory array 100 and the pointer array 130. While this chip organization is particularly useful in the case of page-oriented memories, it should be noted that this and other embodiments described herein can be used in non-page-oriented memories.

In this embodiment, the memory array 100 comprises a plurality of field-programmable, non-volatile, write-once, anti-fuse memory cells that are arranged in a plurality of layers stacked vertically above one another in a single integrated circuit to form a three-dimensional memory array, as described in U.S. Pat. No. 6,034,882, which is assigned to the assignee of the present invention and is hereby incorporated by reference. It should be noted that other types of memory arrays can be used. For example, a two-dimensional memory array can be used instead of a three-dimensional memory array, and write-many memory cells can be used instead of write-once memory cells. These preferred embodiments are particularly useful for non-volatile memory arrays, even if write-many, because write-once and write-many non-volatile memory arrays tend to be read more often than they are written. A pointer entry, once written, is used each time the associated data is read. While the memory cells in this embodiment are formed from a semiconductor material, other materials, such as phase-change materials and amorphous solids as well as those used with MRAM and organic passive element arrays, can be used. Further, while any type of write-once or write-many memory cells can be used with these preferred embodiments, it is presently preferred that the write-once or write-many memory cells be constructed as described in the following patent applications, each of which is assigned to the assignee of the present invention and is hereby incorporated by reference: write-once—U.S. patent application Ser. Nos. 09/192,883; 09/814,727; 09/928,536; 10/185,508; and 10/326,470; write-many—U.S. patent application Ser. Nos. 09/927,648; 10/180,046; 10/325,951; 10/335,078; and 10/335,089.

In one embodiment, the memory is part of a modular memory device (such as a memory card or stick) that is removably connectable to a host device (e.g., a digital camera, a digital audio player, a person digital assistant, etc.) via mating connections that reads data from/writes data to the memory array 100. In another embodiment, the pointer array 130 along with associated circuitry 140, 150, 170 is provided on a second integrated circuit in the host device.

As with other page-oriented memories, a write or read operation for the chip in this embodiment involves transferring a page of data between the memory array 100 and the page buffer 160 and then, at a different time, transferring the page of data between the page buffer 160 and chip input-output pads (not shown). The transfer of data between the memory array 100 and the page buffer 160 can involve many steps controlled by the control circuitry 190 including write cycles and verifying read cycles (and, as discussed below, writing bad bit pointers). The transfer from the page buffer 160 to the chip input-output pads can involve a relatively large number of sequential transfers in accordance with specifications that are well known in the art. Unlike other page-oriented memories, the memory chip organization of this embodiment facilitates operations to correct data on-the-fly in a user environment (i.e., when field programming the memory array 100). In general, when there is an error in writing data in one of a plurality of memory cells, a pointer is stored identifying which memory cell in the plurality of memory cells contains the error. When the data is later read from the plurality of memory cells, the pointer is also read. The memory cell that contains the error is identified from the pointer, and the error is corrected.

More specifically, during a write operation, a page of data is sent to the page buffer 160 from a host device via the chip input/output pads. The control circuitry 190 provides signals to the row and column circuitry 110, 120 to select a row and sequence through various columns in the memory array 100 to copy the page of data from the page buffer 160 to the memory array 100. Next, the read-after-write comparison logic 180 reads the data just stored in the memory array 100 and compares it to the data stored in the page buffer 160 (i.e., the desired data). If there is a mismatch between the data stored in the memory array 100 and the data stored in the page buffer 160, an error has occurred in writing the data. An error can also be detected if it is determined that a bit may be unreliably read in later operations. For example, the read-after-write comparison logic 180 can include read margin conditions such as adjusting the reference current used for sensing the current from a memory cell. With sufficiently large read margining, any bits that would be unreliably read in later operations can be replaced, thereby reducing or eliminating the need for ECC. (As described below, ECC can be used in combination with a bad bit pointer.) As an alternative to using the read-after-write comparison logic 180 to detect an error, individual bit errors can be detected while programming a page using the sensing-while-programming technique described in U.S. patent application Ser. No. 09/896,815, which is assigned to the assignee of the present invention and is hereby incorporated by reference.

If the read-after-write comparison logic 180 determines that an error has occurred, it writes the correct data bit in the pointer buffer 170 and sends an error signal to the control circuitry 190, which writes the address of the bad bit in the pointer buffer 170. The "bad bit pointer" stored in the pointer buffer 170 is then written in the pointer array 130. (As described below, instead of using a pointer array 130, bad bit pointers can be stored in an set of extra memory cells in the memory device ("in the sideband") or in a device separate from the memory device.) The writing of the bad bit pointer can be confirmed by a read-after-write operation or some other check.

During a read operation, the control circuitry 190 transfers a page of data from the memory array 100 into the page buffer 160 and transfers the appropriate pointer(s) from the pointer array 130 into the pointer buffer 170. In a preferred embodiment, bad bit pointers for all bad bits in the memory array 100 are written in the pointer array 130 without skipping pointer locations. Accordingly, valid pointers can be found sequentially in the pointer array 130. It is further preferred that each bad bit pointer comprises a valid bit pointer flag (e.g., 010), as described below, and that any entry without a valid bad bit pointer flag (and subsequent entries) be ignored. This allows the control circuitry 190 to access the pointers stored in the pointer array 130 sequentially until it locates a pointer with an invalid flag. Once the control circuitry 190 locates a pointer with an invalid flag, the control circuitry 190 stops reading pointers, thereby reducing the overhead time to read the pointers from the pointer array 130.

From the pointer in the pointer buffer 170, the control circuitry 190 identifies which bit is in error and corrects the bit in the page buffer 160 (e.g., by changing its current value (1 or 0) to an opposite value (0 or 1) or by programming the bit with a value specified in the pointer). The control circuitry 190 performs this error correction process for each pointer stored in the pointer buffer 170 for the page. The control circuitry 190 then sends the corrected page of data from the page buffer 160 to the host device via chip input/output pads.

The use of bad bit pointers provides advantages over row or column redundancy and ECC to repair random bad bits, especially in page-oriented memories. Because the exact location of the bad bit is identified by the pointer, an entire row or column of mostly error-free bits need not be replaced. Because previously-written pages in the bad column do not need to be replaced when using bad bit pointers, the problem encountered when column redundancy is used to repair a single bad cell in a page-oriented memory is eliminated. Additionally, since multiple bad bit pointers can be used for a single page, bad bit pointers can be used to correct multiple errors to deal with high defect densities, unlike ECC schemes that can correct only a single error in a given group of bits. Alternatively, in cases of very low defect densities, the number of bad bit pointers for a page can be small and require less overhead than ECC. Accordingly, bad bit pointers, unlike ECC, can efficiently be adapted to varying defect densities.

Figure 2:
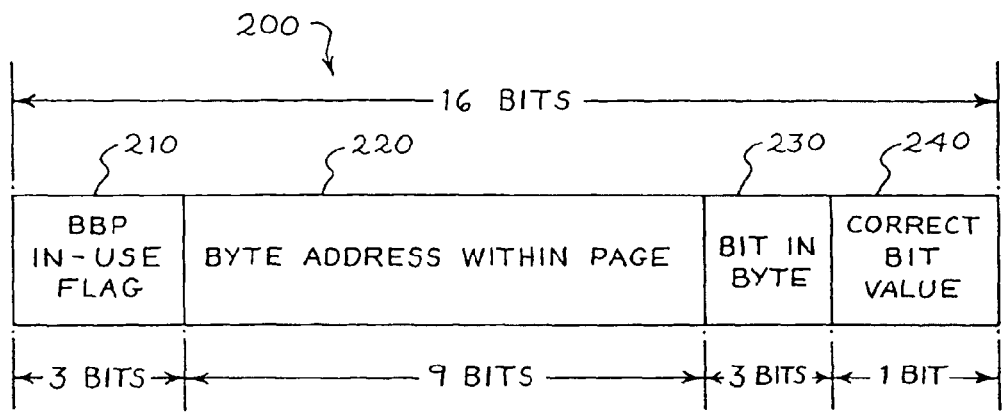
FIG. 2 is an illustration of a bad bit pointer of a preferred embodiment.

A bad bit pointer can take any suitable form. FIG. 2 is an illustration of a bad bit pointer of a presently preferred embodiment used with pages containing 512 bytes of data. The bad bit pointer shown in FIG. 2 uses 16 memory cells in the pointer array 130 (or in extra memory space dedicated to bad bit pointers). The first three bits in the pointer 200 are a redundant flag (a bad bit pointer in-use flag 210) that indicates that the two bytes in the pointer array 130 contain a bad bit pointer. When an anti-fuse memory cell is in a programmed state, the anti-fuse conducts current. This is a zero, and writing a bit means the state stored at the bit is changed from a one to a zero. The redundant flag is devised to avoid matching patterns produced by array defects. For example, a flag value of "010" can indicate a valid bad bit pointer. All ones or all zeroes are preferably avoided because an array defect can make the bits read all ones or all zeroes. The flag is preferably made triply redundant in cases where there is little or no error correction or repair for the pointers themselves. Even if there are defects in the pointer array, the probability of the circuitry making an unintended replacement is very low. The next nine bits in the pointer 200 contain the byte address within the page 220 where the error occurred, and the next three bits (the bit in the byte 230) indicate which bit within that byte contains the error. The final bit (the correct bit value 240) contains the correct data value of the bit containing the error.

The number of bits dedicated to each purpose in the bad bit pointer can be varied for different situations. For example, in page sizes larger than 512 bytes, more address bits would be needed. Further, if defects tend to affect more than one bit in a byte, it might be preferable to choose four bits or even a byte of data for the size of the replacement unit and reduce the number of bits for the location of the bit in the byte. Additionally, in cases where the bad bit pointer can also be repaired or corrected with ECC, the number of flag bits can be reduced to one. Further, if the correct data bit can be inferred from the value in the bad memory cell, the correct data bit need not be stored in the pointer buffer 170.

There can be any number of bad bit pointers associated with each page. An optimum choice would be made based on the defect density in the memory technology. A typical choice is eight pointers per page. The pointers are any-for-any associative with bits in the main page data. Further, in some definitions of a page of data, there are extra bytes of data called extended page space from bytes 512 to 527. The bad bit pointers can be located in this extended page space (instead of in the pointer array 130) when it is otherwise unused. If that space is used for other purposes, then it is preferred to use the pointer array 130 to provide the extra cell location needed for bad bit pointers. Preferably the memory array 100 and the pointer array 130 are two separate arrays, as shown in FIG. 1, to simplify connection to the control circuitry 190. However, the pointer array 130 can, instead, be an integral part of the memory array 100 (e.g., in the same or different sub-arrays) or can be located external to the memory device.

In the memory chip organization shown in FIG. 1, the bad bit pointer mechanism was used without ECC logic. However, in some manufacturing processes, the number of random bad bits can be so large that the number of bad bit pointers would be excessive. Accordingly, ECC bits and ECC logic can be added to the memory chip organization shown in FIG. 1 to provide additional protection. An embodiment in which the bad bit pointer mechanism is used in combination with ECC logic will be illustrated in conjunction with the block diagram shown in FIG. 3. As shown in FIG. 3, ECC logic 300 is placed in the path between the page buffer 310 and the column circuitry 320 associated with the memory array 330. (Alternatively, the ECC logic 300 can be placed between the page buffer 310 and the chip input/output pads.) Additional ECC logic 340 is placed in the path between the pointer buffer 350 and the column circuitry 360 associated with the pointer array 370. In a preferred embodiment, ECC correction is performed on the chip on a 64-bit group of four pointers. Accordingly, four sequential pointers with all bits (including the correct bit value) are written at a time.

In this embodiment, bad bit pointers are first used for occurrences of two bad bits in an ECC group, fixing at least one of the bad bits. ECC groups that have only one error can be repaired if there are additional unused pointers. In operation, when the control circuitry 380 initially writes data in the memory array 330, it sends a "disable ECC calculation" signal to the ECC logic 300 so no ECC bits are written with the data in the memory array 330. The read-after-write comparison logic 390 also performs its operation without ECC adjustment. After storing the bad bit pointers in a pointer buffer 350, the error (or "stuck") values for the failing locations are substituted in the page buffer 310 for the correct values, and then the ECC logic 300 is enabled to write the ECC bits for the adjusted data in the memory array 330. By making the ECC bits compatible with the main page data modified with the stuck values, the ECC bits can be used to correct a new random single bit error occurring in the main data.

In the embodiments described above, the bad bit pointers were written at time of programming. In an alternate embodiment, the bad bit pointers are written during testing of the memory at the factory instead of or in addition to at the time of programming. The embodiments described below will illustrate how column and/or row redundancy can be used in conjunction with bad bit pointers (and, optionally, ECC) to provide even higher reliability.

Turning first to column redundancy, traditional column redundancy redirects reads and writes from a bad column to a redundant column. In this embodiment, bad bit pointers are used instead of using column redirection to accomplish column redundancy. Like traditional column redundancy, the writing of bad bit pointers to deal with stuck bit lines is done at time of manufacture. (Bad bit pointers can be used only to deal with stuck bit lines at the time of manufacture or can be used both at the time of manufacture to deal with stuck bit lines and at the time of programming.) The simplest approach only attempts to correct bits on stuck zero bit lines. In an anti-fuse memory, the programmed state is called a zero. If a bit line has a defect, such as a short to an adjacent bit line that causes all bits along the line to be read as a zero, it is called stuck-at-zero bit line. Reading the unused memory, which should be all ones, easily detects stuck-at-zero bit lines. The stuck bit line affects the same bit location in many rows. At the time of manufacturing the memory, the bad bit pointer buffer can be initialized with the stuck bit line location for this group of rows by reading the initial state of the memory cells. For each row, a bad bit pointer is placed in the extra cells. The pointer is partially written, i.e., with the flag and the location of the bad bit but without the data. ECC is turned off for partially writing the pointers. When each page is written, the pointers are read and stored in the pointer buffer. The correct data for the stuck bit line location is also stored in the pointer buffer. The memory array and pointer array are then written with ECC logic enabled so ECC protects the memory from further random errors.

Before turning to a discussion of how bad bit pointers can be used in conjunction with row redundancy, a preferred method of row redundancy will be discussed in conjunction with the block diagram shown in FIG. 4. The chip organization shown in FIG. 4 comprises a memory array 400 with a portion for normal rows 410, a portion for redundant rows 420, a portion for row flags 430, and a portion for redundant row flags 440. The chip also comprises a leakage current detector 450, self-repair circuitry 460, control circuitry 470, a page buffer 480, a flag buffer 485, column circuitry 490, row circuitry 495, and redundant row circuitry 497. This chip organization can be used to provide on-the-fly row redundancy, as described in U.S. patent application Ser. No. 10/024,646, which is assigned to the assignee of the present application and is hereby incorporated by reference. In general, when there is an error in writing data to a row in the normal row portion 410 of the memory array 400, the data is written in the redundant row portion 420, and a flag is set in the row flag portion 430. A flag is also set in the redundant row flag portion 440 to store information about the repair, as described in the '646 patent application.

Figure 5:
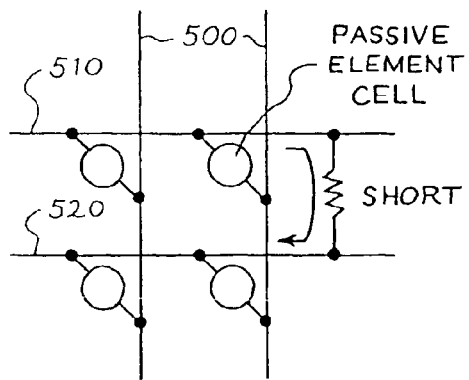
FIG. 5 is a diagram illustrating a bias for detecting row-line-to-row-line shorts in the memory shown in FIG. 4.
Figure 6:
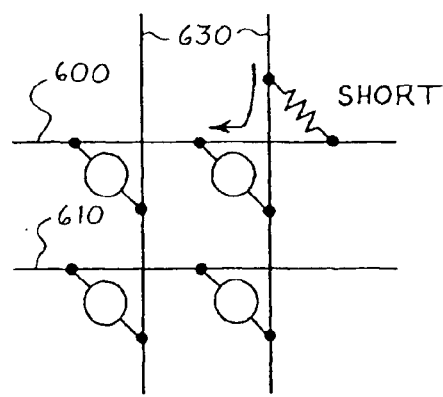
FIG. 6 is a diagram illustrating a bias for detecting row-line-to-column-line shorts in the memory shown in FIG. 4.

In addition to being performed on-the-fly while the memory array 400 is being programmed with data, this row redundancy method can be performed at the factory while the memory array 400 is being tested. In this regard, this preferred embodiment comprises an on-chip leakage current detector 450 that determines whether a row should be replaced using the procedure described above. The on-chip leakage current detector 450 can operate in a first or second short detection mode. In the first short detection mode, the control circuitry 470 selects a row line, and, as shown in FIG. 5, the array is biased such that the column lines 500 of the array are at the same voltage ($V_{dd}$) as the selected row line 510. The unselected row lines 520 are at a lower bias level (~0.5 volts). A short from the selected row line 510 to other row lines 520 is detected as a current into the row bias line, which supplies current to the selected row line 510 through a switch in the row circuitry 495. A detected current causes as error signal to the self-repair circuitry 460, which causes the control circuitry 470 to write flag bits for the selected row in a row flag portion 430 of the memory array 400. Preferably, the flag entry has associated bits indicating which of several possible redundant rows should be substituted for the defective row, as described in the '646 patent application. In the second short detection mode, the selected row line 600 is at the same bias as the unselected row lines 610 (see FIG. 6). The bias of the selected and unselected row lines 600, 610 (~0.5 volts) is substantially less than the bias of the column lines 630 ($V_{dd}$). A short between column lines 630 and the selected row line 600 causes a current flowing from column lines 630 to the selected row line 600. The leakage current detector 450 connected to the row bias line produces an ERROR signal, which produces a self-repair operation as above.

Figure 7:
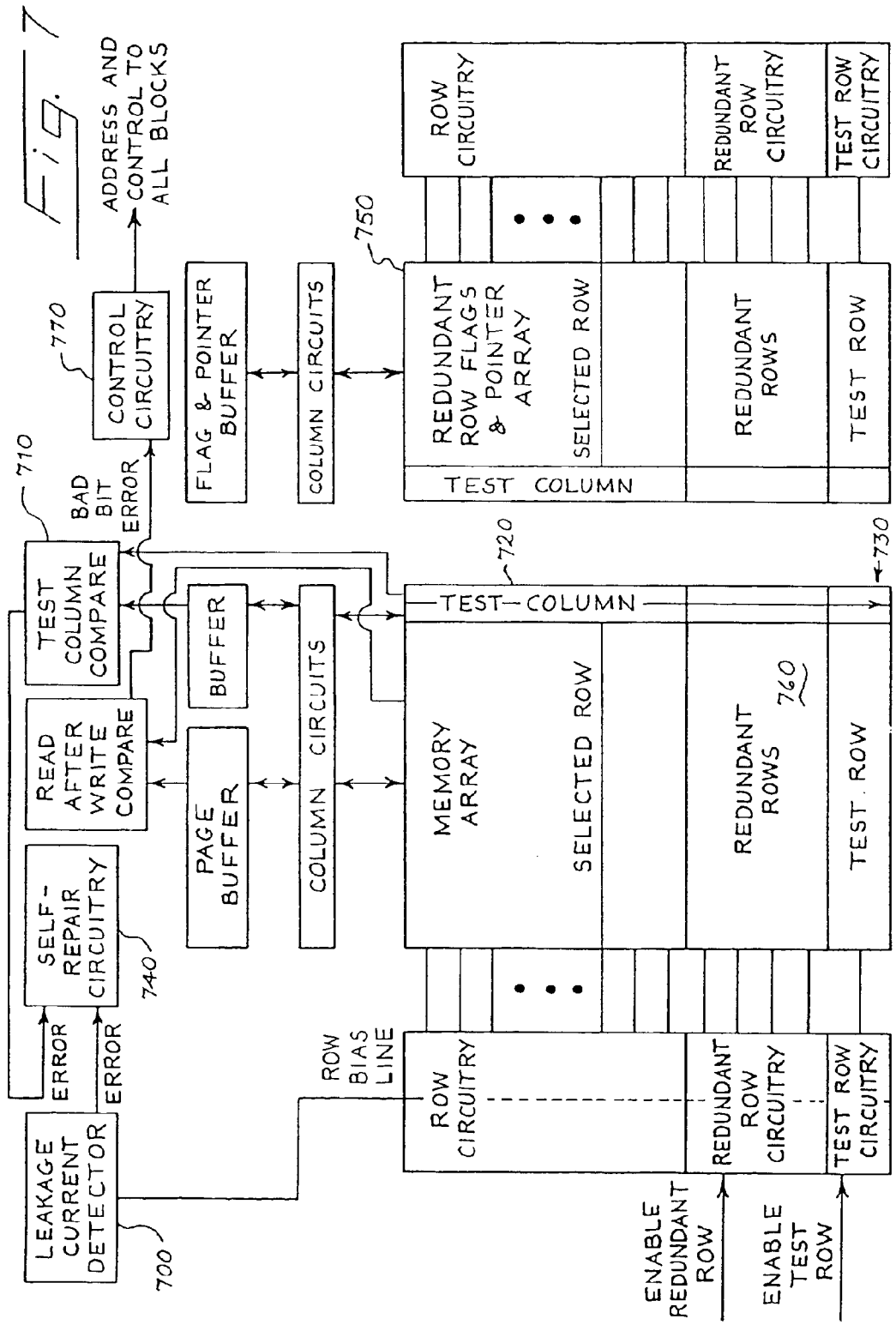
FIG. 7 is a block diagram of a memory chip organization of a preferred embodiment that uses bad row detection, row self-repair, and bad bit pointers.

FIG. 7 will now be used to illustrate how row redundancy can be used in combination with bad bit pointers. The optimum strategy can vary depending on defect densities. One example is to use row replacement initially based on circuitry that detects bad rows. Bad rows can be identified by any suitable means such as that described in U.S. Pat. No. 6,515,923, which is assigned to the assignee of the present invention and is hereby incorporated by reference. Row lines shorted to other row lines or column lines are detected by the leakage current detector 700, as described above. Open row lines are detected by a test column compare circuit 710, which compares data from cells in a test column 720 on the far end of the row lines of the memory array 730 to expected data. Either error indication activates self repair circuitry 740, which writes flags in the pointer array 750 (or in any other suitable set of extra memory cells) to cause a replacement of the bad row by a redundant row in the redundant row portion 760 of the memory array 730, as described in the '646 patent application.

After the replacement of bad rows, the control circuitry 770 detects bad bit locations on normal rows or activated redundant rows as addressed and writes pointer entries as described above. Next, if on a given row the verification of the bad bit pointers fails or there is insufficient room for the required bad bit pointer, the given row is replaced by a redundant row, and bad bit pointer write circuitry detects bad bits and writes entries again. If this fails a second time, a write error is reported, and the write operation ends. Flag data is stored with pointer data for logic simplification. In manufacturing, separate tester electronics can control and interact with the memory circuitry to carry out portions of the row replacement mechanism, such as leakage detection or test column comparison. The row replacement flags are still written on the memory chip and read control logic on chip interprets the flags to replace rows with redundant rows. This provides flexibility in test routines and reduces the memory chip area.

Figure 8:
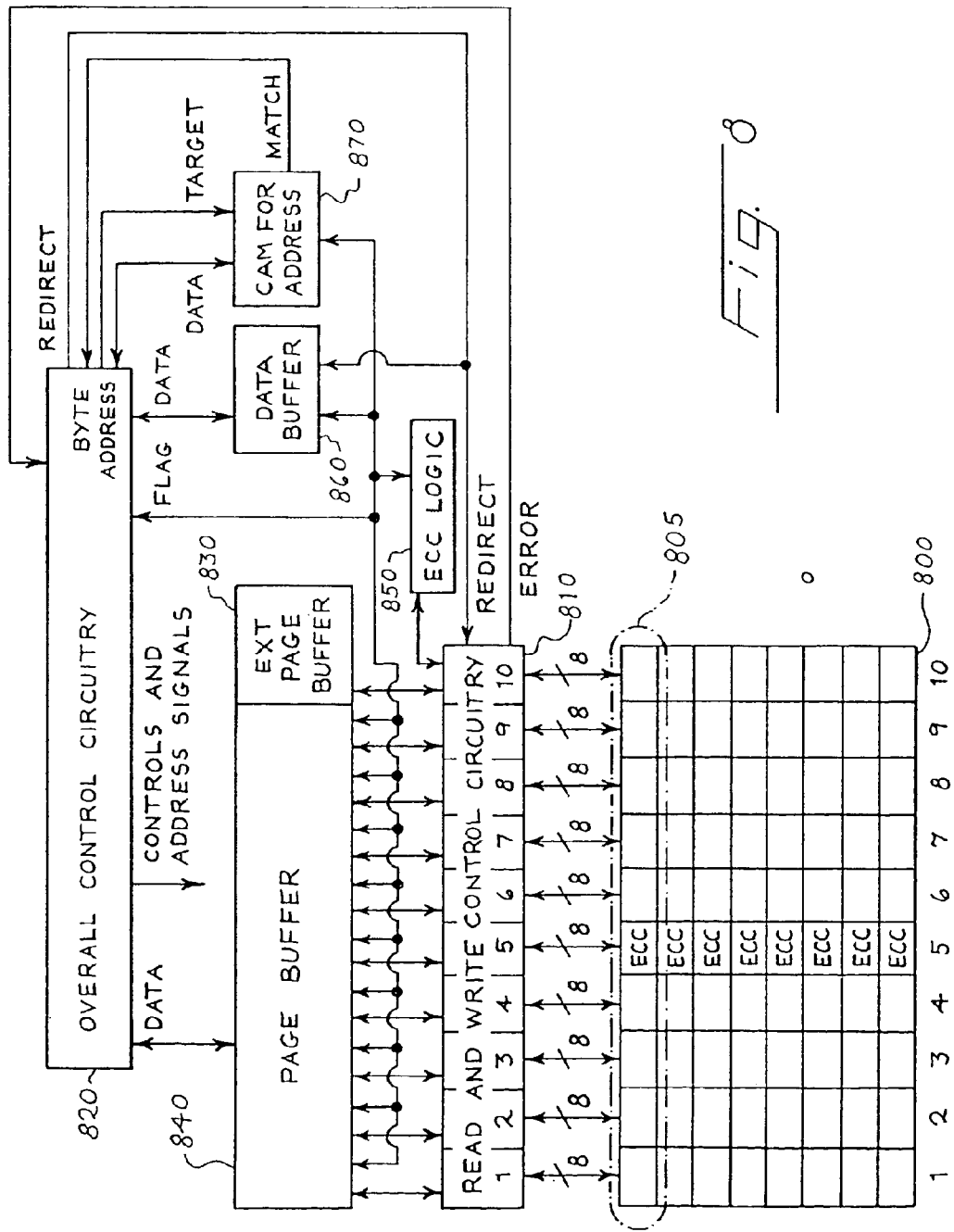
FIG. 8 is a block diagram of a memory chip organization of a preferred embodiment that uses bad bit pointers and logic implemented with a content addressable memory (CAM) array.

Turning again to the drawings, FIG. 8 is a block diagram of an embodiment in which bad bit pointers and logic are implemented with a content addressable memory (CAM). In this embodiment, the memory array 800 is divided into 80 sub-arrays. A sub-array is a contiguous group of memory cells having contiguous word and bit lines generally unbroken by decoders, drivers, sense amplifiers, and input/output circuits. Memory sub-arrays are preferably used in horizontal groups (such as group 805) to store all the information for one page transfer. The group can be physically arranged differently, but this arrangement is convenient. One or a few pages of data are all arranged in one row of memory cells as shown. Spreading the data to multiple sub-arrays is preferable for the operation of error correcting logic, as described in U.S. patent application Ser. No. 10/024,647, which is assigned to the assignee of the present application and is hereby incorporated by reference. Sub-array selection within the group to reduce peak power is described in U.S. patent application Ser. No. 09/748,649, which is also assigned to the assignee of the present application and hereby incorporated by reference. Eight of the sub-arrays in the group contain normal page data. A ninth sub-array (column 5) contains ECC bits, and the tenth sub-array (column 10) contains extended page data, flags for row redundancy, and bad bit pointers.

The column circuitry includes read and write control circuitry 810, sense amplifiers, and column decoding logic. The sense amplifiers and column decoding logic are preferably distributed in the sub-arrays in a checkerboard manner, as described in U.S. patent application Ser. No.

09/896,814, which is the assignee of the present invention and is hereby incorporated by reference. For a given sub-array, several column lines (in this case, 8 column lines) are connected to sense amplifiers by the column decode logic. An 8-bit data path and control signals connect the sense amplifiers to the read and write control circuitry 810. The read and write control circuitry 810 is replicated for the number of selected sub-arrays, so all selected sub-arrays (in this case, 10 sub-arrays) can be accessed in parallel. The row circuitry (not shown) is also distributed in a checkerboard arrangement. The data in the $10^{th}$ sub-array is directed to the desired path by control signals from the overall control circuitry 820. Extended page data from the $10^{th}$ column is directed to the extended page buffer 830 in the page buffer 840. The bad bit pointers path is modified by ECC logic 850 when activated. Flag bits are interpreted by the overall control circuitry 820, bad bit pointer data is directed to the data buffer 860, and bad bit pointer location address bits are directed to a content addressable memory (CAM) 870. The CAM 870 provides a MATCH signal to the overall control circuitry 820 when any entry in the CAM 870 matches the target input, which comes from the byte address output of the overall control circuitry 820. The read and write control circuitry 810 directs data from the page buffer 840 to the memory array 800 and from the bad bit pointer data buffer 860 and the CAM 870 to the memory array 800. When a redirect signal is given to the read and write control circuitry 810 and the bad bit pointer data buffer 860, the data is redirected such that the, path is between the page buffer 840 and the data buffer 860.

In a preferred embodiment, 8 bits of data are redirected, and the bad bit pointer contains 8 bits of data. The bad bit pointer for this byte-size replacement unit has flag information, a byte location address, and a data byte, but the bit location in the byte is not needed. The bad bit pointer is protected by a {24,18} Hamming single-bit error correcting/double-bit error detecting code. For 512 bytes in a page plus 16 bytes of extended page space plus ECC bytes, 10 bits are used for the location and the flag. The UNUSED flag indication is chosen from the undefined addresses. The bad bit pointer and the ECC bits are, in total, 24 bits of data.

The redirection of entries to the data buffer 860 can be done at any of several indications of a problem. The optimum method depends on the level of manufacturing defects in the array 800 and the desired application. Bad bit pointer redirection is, in some cases, indicated by a test procedure that precedes the actual write operation, as described in the stuck-zero-bit-lines embodiment above. The bad bit pointer location information is written into the sub-array. Later, for writing the page data, the CAM 870 is preloaded with the bad bit pointer byte location addresses, and the page buffer 840 is loaded with the page data. Next, the overall control circuitry 820 sequences through byte addresses, causes the transfer of data from the page buffer 840 to the memory array 800 and causes the redirection of data to the bad bit pointer data buffer 860 when the CAM 870 produces a MATCH signal for the current byte address. The redirected byte of data is later written into a bad bit pointer entry in the $10^{th}$ sub-array along with ECC bits.

In other cases, a read-after-write confirmation, as described above with reference to FIG. 1, is used to generate bad bit pointer entries. After completion of the page write cycles, the data is read from the memory array 800 and compared to the contents of the page buffer 840. Detected errors cause the correct data to be stored in the bad bit pointer data buffer 860 and cause location addresses to be stored in the CAM 870. At the end of the comparison, bad bit pointer entries are written into the memory array 800. In a preferred embodiment, both of these methods are used.

In another case, an ERROR signal produced by the read and write control circuitry 810 in response to a sensing-while-programming error (see U.S. patent application Ser. No. 09/896,815, which is assigned to the assignee of the present invention and is hereby incorporated by reference) redirects the data byte to the bad bit pointer data buffer 860. In this embodiment, every error causes a redirection. If the number of redirection requests exceeds the available number of bad bit pointer locations, the overall control circuitry 820 forgoes writing the bad bit pointer entry and instead initiates a row replacement self-repair operation, as described above.

In all these cases, a read operation makes use of the bad bit pointers by loading the bad bit pointers into the data buffer 860 and the CAM 870 at the beginning of the read operation. Flag bits are observed by the overall control circuitry 820 to load only valid bad bit pointer entries. Row redundancy flags are also observed to determine if a redundant row must be used. While the overall control circuitry 820 causes the transfer of page data bytes from the main memory array 800 to the page buffer 840, it sends the byte address to the target input of the CAM 870 and detects any MATCH signal. If there is a MATCH signal, the overall control circuitry 820 sends a REDIRECT signal to the read and write control circuitry 810 of the column circuitry and the bad bit pointer data buffer 860 to transfer the correct data byte from the data buffer 860 to the page buffer 840 using a common bus between the buffers 840, 860.

There are several alternatives that can be used with these embodiments. For example, in the embodiments described above, a single integrated circuit (or chip) contains the memory array and circuitry used to both write bad bit pointers and to read the bad bit pointers and make the appropriate bit substitutions. In an alterative embodiment, the memory array, the bad bit pointer write circuitry, and the bad bit pointer read circuitry are on two or three separate integrated circuits. For example, the memory array, the bad bit pointer write circuitry, and the bad bit pointer read circuitry can each be on a separate integrated circuit, or two components (e.g., the memory array and the bad bit pointer read circuitry) can be on one integrated circuit, and the other component (e.g., the bad bit pointer write circuitry) can be on another integrated circuit. The multiple integrated circuits can be in the same device or located in different devices, such as when the memory integrated circuit is in a memory card and the other integrated circuit is in a host device.

FIG. 9 is an illustration of an embodiment in which the memory array, the bad bit pointer write circuitry, and the bad bit pointer read circuitry are located on separate integrated circuits. More specifically, a first integrated circuit 900 comprises a memory array 910, a page buffer 920, a pointer buffer 925, and ECC logic 930; a second integrated circuit 940 comprises bad bit pointer write control circuits 950 and a table of error locations 960; and a third integrated circuit 970 comprises bad bit pointer read substitution logic 980 and a page buffer 990. As mentioned above, instead of using three integrated circuits, two integrated circuits (or a single integrated circuit) can be used to combine the memory, the logic used to program the bad bit pointers, and the logic that does the read replacement of the bad bit pointers. As also mentioned above, the integrated circuits 900, 940, 970 can be part of the same or different devices. Placing the integrated circuits 900, 940, 970 in different devices can be useful in applications where the programming of the non-volatile memory 910 is in a separate environment than the typical read environment.

Consider, for example, the situation in which the second integrated circuit 940 is part of a PC-like piece of hardware in a music store that programs an MP3 file of a music selection in the memory array of the memory integrated circuit 900. The memory integrated circuit 900 can be sold to a user, who later plays the MP3 file by inserting the memory integrated circuit 900 into a reading device, such as a small portable MP3 player, which contains the third integrated circuit 970. In operation, the data to be written in the memory array 910 is sent through bad bit pointer write control circuitry 950, which identifies the bad location, substitutes the stuck bit values in the main page, and writes the bad bit pointers. For ECC compatibility, the bad bit pointer write control circuitry 950 can disable the action of the ECC logic 930 so that ECC is off when detecting bad locations. In this case, the ECC calculation can be performed during the transfer of data between the page buffer 920 and the memory chip input-output pads as shown in the alternate arrangement of the ECC block on the memory chip. The bad bit pointer read substitution logic 980 is a separate mechanism, which in one embodiment contains a page buffer 990, and places data for the page buffer 920 into the page buffer 990 and substitutes data from the pointer buffer 925 to the erroneous data locations in the pointer buffer 990.

In another alternative embodiment, bad bit pointers are used in non-volatile, random-access memories such as, but not limited to Magnetic RAM (MRAM), Ferroelectric RAM (FeRAM), Ovonic Unified Memory (OUM), and Nor Flash memory. FIG. 10 is a block diagram of such an alternate embodiment. As shown in FIG. 10, this chip organization comprises a memory array 1000 associated with row circuitry 1010, a data latch and sense amplifier 1020, and column circuitry 1030. The chip also comprises a pointer array 1040 associated with row circuitry 1050, sense amplifiers 1060, a distributed CAM and latches 1070, and a data latch 180. In addition, the chip has control logic 1090 that provides address and control information to each of the blocks shown in FIG. 10.

The page register function in a random-access memory is in a circuit typically called sense amplifiers or data latches 1020. It is typically coupled to the memory array 1000 by a large number of parallel paths and is typically located near the memory array 1000. It is distinguished from a page-oriented memory in that data is quickly transferred from the memory array 1000 to the data latches, and bits can be randomly accessed in the page register. Further, the maximum time to transfer any bit to the chip outputs is much smaller than in a page-oriented architecture. A preferred method of using bad bit pointers in random access memories is to mimic the protection of column redundancy. At manufacturing test, bad columns are detected, and bad bit pointers are written in the pointer array 1040 (or in other extra cells dedicated to pointers). The sense amplifier and data latch circuitry is modified to include a CAM capability 1070 for the location and flag portion of the pointer data. The column address is compared to the location information, and a hit indication modifies the path from the memory array 1000 to the chip input or output such that the data is written or read at the pointer array 1040 rather than the memory array 1000. The bad bit pointers achieve very flexible associativity of pointer entries to main array entries and use very small memory cells instead of the large fuses and large fuse compare circuits in conventional column redundancy mechanisms.

In summary, the preferred embodiments described herein can be used to fix random bit errors by using a pointer that has an ideal any-for-any replacement in a row of memory cells that can contain one or more pages of data. This bad bit pointer scheme is especially efficient when combined with row redundancy that replaces a large number of bits along a row or even the entire row. As the page of memory is being written or read, large numbers of fails can initiate a row replacement, while small numbers of fails can initiate the bad bit pointer repair mechanism. Bad bit pointers can be used in combination with row redundancy and ECC. Each page can have bad bits on unique bit lines, and these preferred embodiments can also be used to repair both stuck zero and stuck one bits. These preferred embodiments provide the ability to repair more errors in the memory using fewer extra memory cells, as compared to methods discussed in the background section. Additionally, the column redundancy described above can efficiently fix single random bad bits without complicating page-oriented memory chips, unlike the column redundancy method described in the background section.

It is intended that the foregoing detailed description be understood as an illustration of selected forms that the invention can take and not as a definition of the invention. It is only the following claims, including all equivalents, that are intended to define the scope of this invention. Finally, it should be noted that any aspect of any of the preferred embodiments described herein can be used alone or in combination with one another.

What is claimed is:

1. A method for correcting an error, the method comprising:
    (a) writing data in a first plurality of memory cells;
    (b) detecting an error in writing data in one of the first plurality of memory cells;
    (c) writing a pointer in a second plurality of memory cells, the pointer identifying which memory cell in the first plurality of memory cells contains the error;
    (d) reading the data from the first plurality of memory cells;
    (e) reading the pointer from the second plurality of memory cells;
    (f) from the pointer, identifying which memory cell of the first plurality of memory cells contains the error; and
    (g) correcting the error.

2. The method of claim 1, wherein the error is detected in (b) by reading data written in the first plurality of memory cells and comparing the read data to data desired to be written in the first plurality of memory cells.

3. The method of claim 1, wherein the error is detected in (b) using a sensing-while-programming technique.

4. The method of claim 1, wherein the data read in (d) is stored in a buffer, and wherein (g) comprises correcting the error in the buffer.

5. The method of claim 1, wherein the first plurality of memory cells are in a first memory array of a memory device, and wherein the second plurality of memory cells are in a second memory array of the memory device.

6. The method of claim 1, wherein the first plurality of memory cells are in a first memory array of a memory device, and wherein the second plurality of memory cells are in a second memory array of a device separate from the memory device.

7. The method of claim 1, wherein the first plurality of memory cells are in a memory array of a memory device, and wherein the second plurality of memory cells are in the same memory array.

8. The method of claim 7, wherein the memory array comprises a plurality of sub-arrays, and wherein the first and second pluralities of memory cells are part of the some sub-array.

9. The method of claim 7, wherein the memory array comprises a plurality of sub-arrays, and wherein the first and second pluralities of memory cells are part of different sub-arrays.

10. The method of claim 1, wherein the first plurality of memory cells are part of a first integrated circuit, and wherein (a)–(c) are performed by a second integrated circuit.

11. The method of claim 1, wherein the first plurality of memory cells are part of a first integrated circuit, and wherein (d)–(g) are performed by a second integrated circuit.

12. The method of claim 1, wherein the first plurality of memory cells are part of a first integrated circuit, wherein (a)–(c) are performed by a second integrated circuit, and wherein (d)–(g) are performed by a third integrated circuit.

13. The method of claim 12, wherein exactly two of the first, second, and third integrated circuits are part of a first device, and wherein the other of the first, second, and third integrated circuits is part of a second device.

14. The method of claim 1, wherein the pointer further identifies a correct value for data in the memory cell.

15. The method of claim 1, wherein the pointer further comprises an in-use flag.

16. The method of claim 15, wherein the pointer written in (c) and additional pointers comprise respective in-use flags and are written sequentially in the second plurality of memory cells, and wherein the pointer written in (c) and the additional pointers are read sequentially from the second plurality of memory cells until an entry is found that does not comprise an in-use flag.

17. The method of claim 1, wherein the first plurality of memory cells comprise write-once memory cells.

18. The method of claim 1, wherein the first plurality of memory cells comprise anti-fuse memory cells.

19. The method of claim 1, wherein the first plurality of memory cells are part of a memory array comprising memory cells arranged in a plurality of layers stacked vertically above one another in a single integrated circuit.

20. The method of claim 1, wherein the first plurality of memory cells are part of a two-dimensional memory array.

21. The method of claim 1, further comprising storing data to be written in the first plurality of memory cells in a buffer, altering the data stored in the buffer to reflect the detected error, and writing ECC bits for the altered data in a third plurality of memory cells.

22. The method of claim 21, wherein (b) comprises detecting two errors, and wherein the pointer in (c) identifies only one of the two errors.

23. The method of claim 1, wherein the first plurality of memory cells are part of a memory array comprising a plurality of bit lines, and wherein the method further comprises:
  during testing of the memory array, detecting an error in a bit line of the memory array;
  partially writing a plurality of pointers in a third plurality of memory cells, the partially-written plurality of pointers identifying the memory cells in the memory array that are affected by the error in the bit line; and
  completing the writing of the plurality of pointers by writing data intended to be stored in the memory cells that are affected by the error in the bit line.

24. The method of claim 23 further comprising storing data to be written in the first plurality of memory cells in a buffer, altering the data stored in the buffer to reflect the detected error, and writing ECC bits for the altered data in a third plurality of memory cells.

25. The method of claim 1, wherein the first plurality of memory cells are part of a memory array comprising a plurality of rows, and wherein the method further comprises:
  during testing of the memory array, detecting an error in a row of the memory array; and
  allocating a redundant row to replace the row containing the row error.

26. The method of claim 25, wherein the row error is detected by a leakage current detector.

27. The method of claim 25, further comprising storing data to be written in the first plurality of memory cells in a buffer, altering the data stored in the buffer to reflect the detected error, and writing ECC bits for the altered data in a third plurality of memory cells.

28. The method of claim 25, wherein the memory array further comprises a plurality of bit lines, and wherein the method further comprises:
  during testing of the memory array, detecting an error in a bit line of the memory array;
  partially writing a plurality of pointers in a third plurality of memory cells, the partially-written plurality of pointers identifying the memory cells in the memory array that are affected by the error in the bit line; and
  completing the writing of the plurality of pointers by writing data intended to be stored in the memory cells that are affected by the error in the bit line.

29. The method of claim 28 further comprising storing data to be written in the first plurality of memory cells in a buffer, altering the data stored in the buffer to reflect the detected error, and writing ECC bits for the altered data in a third plurality of memory cells.

30. The method of claim 28, wherein the memory array comprises memory cells arranged in a plurality of layers stacked vertically above one another in a single integrated circuit.

31. The method of claim 1, wherein the first plurality of memory cells are part of a memory array comprising a plurality of rows, and wherein the method further comprises determining whether more than a predetermined number of errors occurred in writing data in a row, and if less than the predetermined number of errors occurred, performing (b)–(g); otherwise initiating a row replacement.

32. The method of claim 1, wherein the first and second plurality of memory cells comprise random access memories.

33. The method of claim 1, wherein the first plurality of memory cells comprise write-many, non-volatile memory cells.

* * * * *